US008353384B2

(12) United States Patent
Stewart, Jr. et al.

(10) Patent No.: US 8,353,384 B2
(45) Date of Patent: Jan. 15, 2013

(54) METHOD AND APPARATUS FOR A LOUDSPEAKER ASSEMBLY

(75) Inventors: William Cameron Stewart, Jr., Raleigh, NC (US); Andrew C. Edwards, Anaheim, CA (US); Michael Hudson, Nashville, NC (US); Andrew Evans, Raleigh, NC (US)

(73) Assignee: RGB Systems, Inc., Anaheim, CA (US)

( * ) Notice: Subject to any disclaimer, the term of this patent is extended or adjusted under 35 U.S.C. 154(b) by 0 days.

(21) Appl. No.: 13/355,430

(22) Filed: Jan. 20, 2012

(65) Prior Publication Data

US 2012/0186902 A1 Jul. 26, 2012

Related U.S. Application Data

(63) Continuation of application No. 12/949,607, filed on Nov. 18, 2010, now Pat. No. 8,127,885, which is a continuation of application No. 12/355,730, filed on Jan. 16, 2009, now Pat. No. 7,866,438, which is a continuation-in-part of application No. 12/163,929, filed on Jun. 27, 2008, now Pat. No. 7,861,825.

(51) Int. Cl.
*H05K 5/00* (2006.01)

(52) U.S. Cl. ........................................ 181/152; 181/148

(58) Field of Classification Search .................. 181/148, 181/152
See application file for complete search history.

(56) References Cited

U.S. PATENT DOCUMENTS

| | | | | |
|---|---|---|---|---|
| 3,985,200 | A * | 10/1976 | Sepmeyer | 181/150 |
| 4,650,031 | A * | 3/1987 | Yamamoto | 181/156 |
| 5,702,785 | A * | 12/1997 | Kuebler et al. | 428/35.2 |
| 6,944,312 | B2 * | 9/2005 | Mason et al. | 381/391 |
| 7,878,296 | B2 * | 2/2011 | Lee | 181/148 |
| 2001/0030078 | A1 * | 10/2001 | Jones et al. | 181/150 |
| 2002/0139608 | A1 * | 10/2002 | Sugiyama et al. | 181/148 |
| 2002/0179366 | A1 * | 12/2002 | Chen | 181/156 |

* cited by examiner

*Primary Examiner* — Forrest M Phillips
(74) *Attorney, Agent, or Firm* — The Hecker Law Group, PLC

(57) ABSTRACT

A loudspeaker assembly is provided. In one or more embodiments the loudspeaker assembly comprises a perforated grille, a three dimensional loudspeaker frame to which a speaker driver is mounted, and a rear baffle. In one or more embodiments, the loudspeaker frame and rear baffle define a controlled volume around the speaker driver. In one or more embodiments the controlled volume comprises a driver cavity and a horn cavity in communication with the driver cavity and a port aperture.

20 Claims, 11 Drawing Sheets

METHOD AND APPARATUS FOR A LOUDSPEAKER ASSEMBLY

CROSS-REFERENCE TO RELATED APPLICATION

This patent application is a continuation of U.S. patent application Ser. No. 12/949,607 filed Nov. 18, 2010, now U.S. Pat. No. 8,127,885 which is a continuation of U.S. patent application Ser. No. 12/355,730 filed Jan. 16, 2009, now U.S. Pat. No. 7,866,438 which is a continuation in part of U.S. patent application Ser. No. 12/163,929 filed Jun. 27, 2008, now U.S. Pat. No. 7,861,825 each of which is incorporated by reference in its entirety herein.

BACKGROUND OF THE INVENTION (1) Field of the Invention

At least one embodiment relates generally to a method and apparatus for a loudspeaker assembly and more particularly to such a method and apparatus that may be installed, for example, in a surface, such as a ceiling.

(2) Description of the Related Art

As loudspeakers are transducers that convert electrical energy to mechanical energy, loudspeaker assemblies are typically designed to satisfy physical constraints, including electrical and mechanical constraints. The degree to which such constraints are satisfied can affect the acoustic performance of the loudspeaker assemblies. When loudspeaker assemblies are installed in a surface, such as a ceiling, it is preferable for the installed loudspeaker assemblies to maintain properties desired of the surface, such as strength, fire resistance, seismic stability, and aesthetics.

U.S. Pat. No. 6,944,312, issued to Mason et al., describes a lightweight fully assembled loudspeaker enclosure that includes a rear baffle having a peripheral edge, a grill that is crimped around the peripheral edge of the rear baffle, and a sound-baffle sheet disposed between the rear baffle and the grill, the sound-baffle sheet having an opening for placement of a loudspeaker. The sound-baffle sheet is described as preferably being made of vinyl or thin MYLAR, and is said to act to prevent sound waves from reentering the loudspeaker.

U.S. Pat. No. 7,120,269, issued to Lowell et al., describes a lay-in tile type system for supporting loudspeakers in a new or existing suspended ceiling, which is further described as including a perforated base section providing maximum free air space. The system is described as having a plate that provides a solid surface for installation of one or more loudspeakers, with a back box optionally mounted over the loudspeaker and secured by nuts.

Prior art systems are not described as satisfying physical constraints, including defining a three dimensional loudspeaker frame structure and providing enhanced acoustic impedance matching, while also being capable of maintaining desired properties, such as strength, fire resistance, seismic stability, and aesthetics.

Furthermore, sound field patterns provided by prior art systems have been less than ideal. The sound pressure levels have varied greatly at various locations relative to loudspeaker systems, which has resulted in variations in perceived sound intensity for listeners at different locations relative to a loudspeaker system as well as for a listener moving with respect to the loudspeaker system. Thus, a method and apparatus for providing a loudspeaker assembly that avoids the disadvantages of the prior art is needed.

BRIEF SUMMARY OF THE INVENTION

A method and apparatus for providing a loudspeaker assembly is provided. In accordance with at least one embodiment, a method is provided for mounting a loudspeaker driver in a loudspeaker driver aperture defined in a ground plane and installing a grille in relation to the ground plane such that a distance between the grille and the ground plane is a function of the distance from the loudspeaker driver. In various embodiments, the distance between the grille and the ground plane increases, is constant, decreases, or varies according to a more complex function, as the distance from the loudspeaker driver increases, resulting in varying sound distribution patterns. In accordance with at least one embodiment, apparatus is provided comprising a ground plane, a loudspeaker driver mounted in a loudspeaker driver aperture of the ground plane, and a grille positioned relative to the ground plane such that a distance between the grille and the ground plane decreases with increasing distance from the loudspeaker driver.

BRIEF DESCRIPTION OF THE SEVERAL VIEWS OF THE DRAWINGS

The present invention may be better understood, and its features made apparent to those skilled in the art by referencing the accompanying drawings.

The use of the same reference symbols in different drawings indicates similar or identical items.

DETAILED DESCRIPTION OF THE INVENTION

Figure 1A:
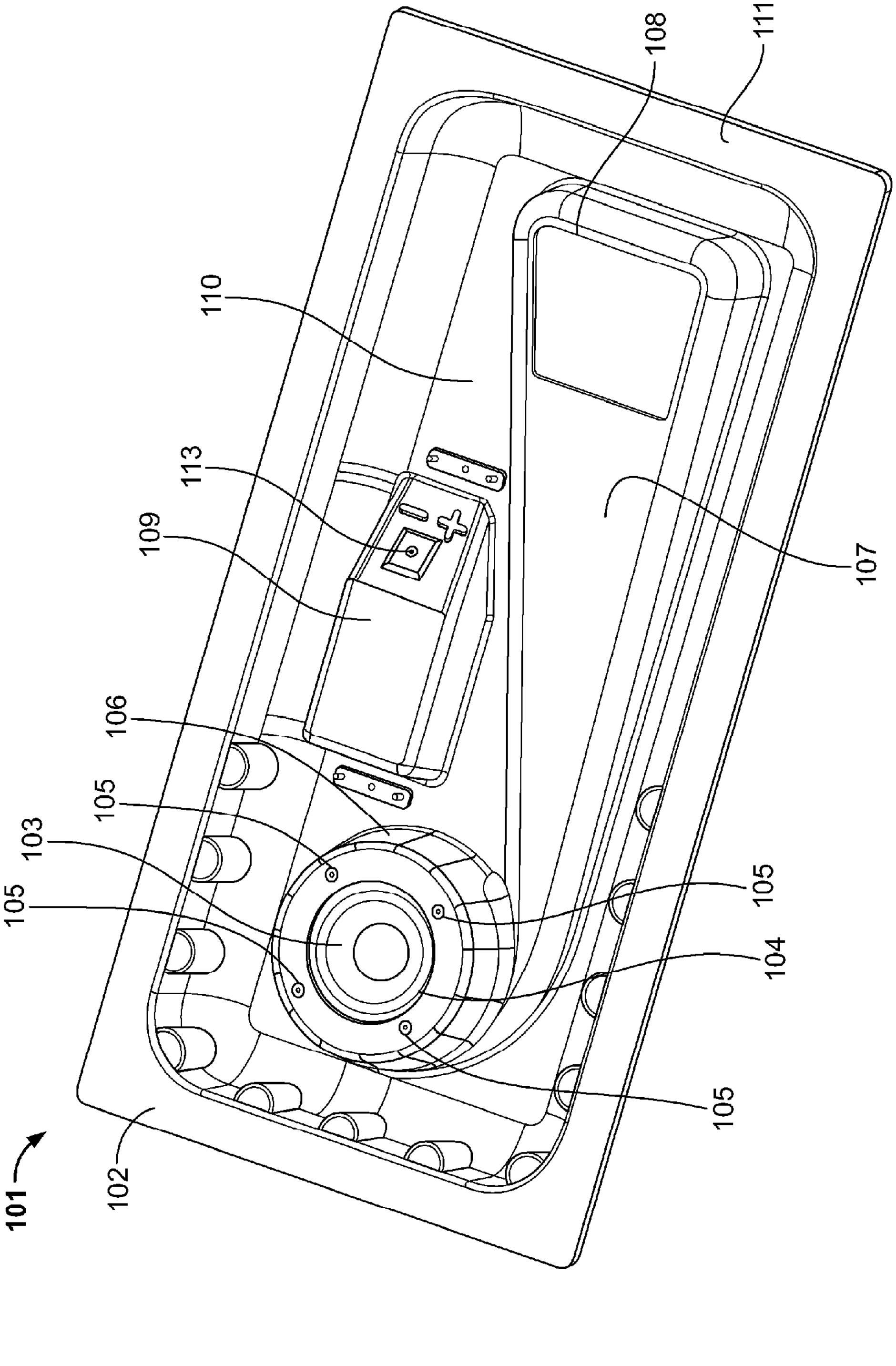
FIGS. 1A and 1B are perspective views of a loudspeaker frame subassembly in accordance with at least one embodiment.

A method and apparatus for providing a loudspeaker assembly is provided. In accordance with at least one embodiment, a method is provided which comprises forming a loudspeaker frame so as to define a driver housing portion, a horn portion, and a conformal portion. A driver aperture is defined for the driver housing portion, and a port aperture is defined for the horn portion. A driver is attached to the loudspeaker frame proximate to the driver aperture. A ground plane is attached to the loudspeaker frame proximate to the driver aperture and the perimeter of the loudspeaker frame. A rear baffle is applied to a first conformal portion surface of the conformal portion of the loudspeaker frame. The rear baffle defines a horn cavity wall of a horn cavity of the horn portion. The horn cavity has an increasing cross sectional area as the distance from the driver housing portion increases. A grille is applied to a second conformal portion surface of the conformal portion of the loudspeaker frame. The application of the grille, which may be performed by crimping a perimeter edge of the grille to the rear baffle, binds the loudspeaker frame to the rear baffle.

In accordance with at least one embodiment, the rear baffle further defines a driver cavity wall of a driver cavity of the driver housing portion. The first conformal portion surface of the conformal portion substantially conforms to a first rear baffle surface of the rear baffle. The grille may be applied such that a first grille portion of the grille is adjacent to the driver aperture and a second grille portion of the grille is adjacent to the port aperture, the first grille portion being substantially coplanar with the second grille portion.

In accordance with at least one embodiment, the rear baffle is formed from a material such that the rear baffle defines the horn cavity wall, which may be covered with a porous or non-porous skin. For example, in one or more embodiments, the rear baffle may be formed from a fire resistant pressed fiberglass or mineral fiber material with a non-porous aluminum skin. The grille may be applied to a substantially planar perimeter portion of the loudspeaker frame so that the substantially planar perimeter portion surrounds an elevated portion of the loudspeaker frame. The elevated portion of the loudspeaker frame surrounds the driver housing portion and the horn portion. In accordance with at least one embodiment, the substantially planar perimeter portion of the loudspeaker frame lies substantially in a first plane and the elevated portion of the loudspeaker frame lies substantially in a second plane, where the first plane is substantially parallel to the second plane.

In accordance with at least one embodiment, apparatus is provided comprising a loudspeaker frame, a driver, a rear baffle, and a grille. The loudspeaker frame defines a driver housing portion, a horn portion, and a conformal portion. The driver housing portion defines a driver aperture, and the horn portion defines a port aperture. The driver is situated adjacent to the loudspeaker frame proximate to the driver aperture. The rear baffle has a first rear baffle surface. A first conformal portion surface of the conformal portion of the loudspeaker frame substantially conforms to the first rear baffle surface. The first rear baffle surface defines a horn cavity wall of a horn cavity of the horn portion. The horn cavity having an increasing cross sectional area as the distance from the driver housing portion increases. The grille is situated adjacent to a second conformal portion surface of the conformal portion of the loudspeaker frame. The grille binds the loudspeaker frame to the rear baffle.

In accordance with at least one embodiment, the rear baffle further defines a driver cavity wall of a driver cavity of the driver housing portion. The first conformal portion surface of the conformal portion substantially conforms to a first rear baffle surface of the rear baffle. The grille comprises a first grille portion adjacent to the driver aperture and a second grille portion adjacent to the port aperture. The first grille portion is substantially coplanar with the second grille portion. The rear baffle is formed from a material such that the rear baffle defines the horn cavity wall. The material may comprise a non-porous skin, such as, for example, aluminum.

In accordance with at least one embodiment, the loudspeaker frame further comprises a substantially planar perimeter portion and an elevated portion. The substantially planar perimeter portion surrounds the elevated portion. The elevated portion surrounds the driver housing portion and the horn portion.

In accordance with at least one embodiment, the substantially planar perimeter portion of the loudspeaker frame lies substantially in a first plane and the elevated portion of the loudspeaker frame lies substantially in a second plane. The first plane is substantially parallel to the second plane.

In accordance with at least one embodiment, a three dimensionally formed sheet defines a driver housing portion, a horn portion, a substantially planar perimeter portion, and an elevated portion. The driver housing portion defines a driver aperture. The driver housing portion is in communication with a narrow end of the horn portion. The cross sectional area of the horn portion increases with distance from the driver housing portion. In accordance with at least one embodiment, the three dimensionally formed sheet is a vacuum formed sheet. In accordance with at least one embodiment, the three dimensionally formed sheet is an injection molded sheet. In accordance with at least one embodiment, the three dimensionally formed sheet is a cast sheet. In accordance with at least one embodiment, the three dimensionally formed sheet is a stamped sheet.

In accordance with at least one embodiment, the substantially planar portion surrounds the elevated portion. The elevated portion substantially surrounds the driver housing portion and the horn portion. The substantially planar portion substantially lies in a first plane. The elevated portion substantially lies in a second plane. The first plane is substantially parallel to the second plane.

In accordance with at least one embodiment, the horn portion defines a port aperture distal to the driver housing portion. The vacuum formed sheet further defines an electrical terminal housing for accommodating electrical terminals. A port aperture cross sectional area of the port aperture is greater than a driver aperture cross sectional area of the driver aperture.

Figure 1B:
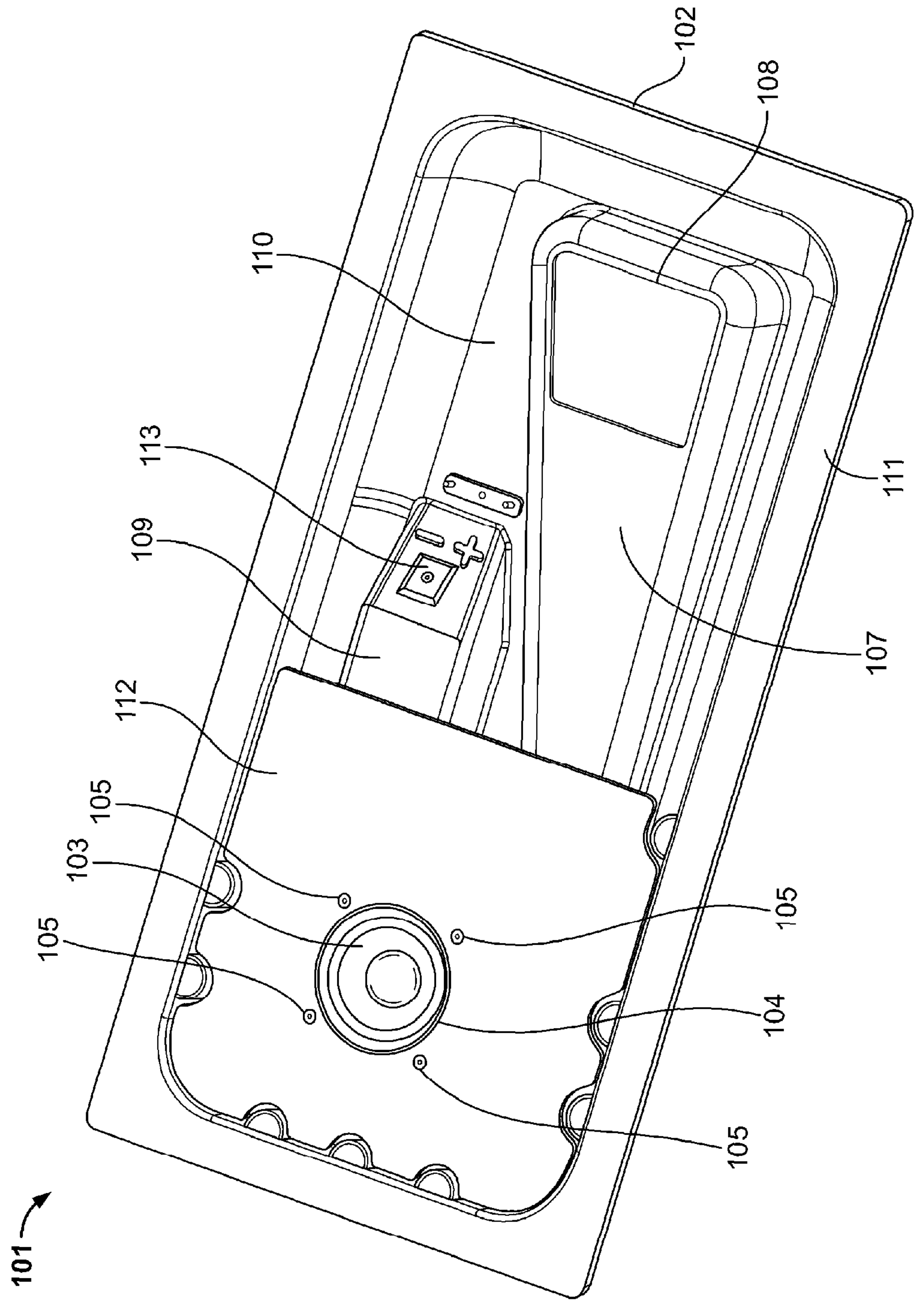

FIGS. 1A and 1B are perspective views of a loudspeaker frame subassembly in accordance with at least one embodiment. FIG. 1A is depicted without ground plane 112 for clarity, while FIG. 1B illustrates a loudspeaker frame subassembly comprising ground plane 112 for completeness. Loudspeaker frame subassembly 101 comprises loudspeaker frame 102, ground plane 112, and driver 103. Loudspeaker frame 102 defines driver aperture 104. Ground plane 112 defines a similar aperture adjacent to aperture 104. Driver 103 is attached to loudspeaker frame 102 and ground plane 112 via fasteners 105, which fasten driver 103 to loudspeaker frame proximate to driver aperture 104. Fasteners 105 are preferably disposed around driver aperture 104. While the term "ground plane" is used, ground plane 112, in accordance with at least one embodiment, is not planar and is not parallel to any particular surface. Rather, ground plane 112 is designed to have a specific curvature introduced during the assembly process, to produce a favorable frequency, and sound pressure level (SPL). In accordance with at least one embodiment, ground plane 112 has a radius of curvature at the center of the loudspeaker aperture of approximately twenty feet. In accordance with at least one embodiment, ground plane 112 has a hyperbolic curvature. In accordance with at least one embodiment, the curvature is concave as viewed from the perspective of FIG. 1 (e.g., through a grille that may be placed in front of the elements illustrated in FIG. 1). In other embodiments, ground plane 112 can have a convex, planar, or other form such that the distance between ground plane 112 and a grille placed in front of the elements illustrated in FIG. 1 is a function of the distance to the axis of driver 103. The function may be such that the distance increases, decreases, remains constant, or varies in a more complex fashion, with resulting variations in the manner in which sound is dispersed.

Loudspeaker frame 102 is preferably vacuum formed into a three dimensional form that defines a driver housing portion 106 and a horn portion 107. The driver housing portion 106 is in communication with the horn portion 107 at a narrow end of the horn portion 107. As the horn portion 107 extends away from the driver housing portion 106, the cross sectional area of the horn portion 107 increases. The rate of increase of the cross sectional area may be linear, exponential, or may conform to a higher order function. The horn portion defines a port aperture 108. The port aperture 108 is disposed distal to the driver housing portion 106. In one or more embodiments, the increasing cross sectional area of the horn portion 107 may provide enhanced acoustical impedance matching by functioning as an acoustical transformer to provide a higher acoustical impedance at the narrow end of the horn portion 107 proximate to the driver 103 and a lower acoustical impedance at the wider end of the horn portion 107 distal to the driver 103 and proximate to the port aperture 108. The increasing cross sectional area may also function to cause a decrease in pressure, causing a "pulling" or vacuum effect accelerating the sound waves towards the port. The acoustical impedance transformation provided by the horn portion 107 allows a small excursion at the driver 103 to move a larger volume of air at port aperture 108, thereby increasing the efficiency of the loudspeaker assembly. This allows the port aperture size to be larger than conventional ported loudspeakers. The effect is that a small driver (e.g., a three inch driver) now functions as a larger driver (e.g., a six inch driver), as the driver size is effectively the sum of the area of the driver and the port combined. A larger port means the loudspeaker functions as if it has a larger driver installed. The use of a smaller driver in conjunction with a horn gives greater efficiency over other designs that use a larger driver without a horn portion. Smaller drivers by design also give a wider dispersion field, which avoids uneven projection of sound in a room. So being able to properly tune the loudspeaker gives a wider sound field letting people use fewer loudspeakers to cover a similarly sized area. Moreover, the driver housing portion 106 and the horn portion 107 form a Helmholtz resonator that can be tuned to enhance the frequency response of the loudspeaker assembly.

In accordance with at least one embodiment, the horn portion 107 has a cross sectional area that substantially conforms to a quadratic function. In accordance with at least one embodiment, the horn portion 107 has a cross sectional area that substantially conforms to the quadratic function $y=0.0234x^2+0.3521x+1.1985$. As one example, in accordance with at least one embodiment, the cross sectional area of the horn portion 107 deviates from that quadratic function by no more than one percent. As another example, in accordance with at least one embodiment, the cross sectional area of the horn portion 107 deviates from that quadratic function by no more than one half of one percent. As yet another example, in accordance with at least one embodiment, the cross sectional area of the horn portion 107 deviates from that quadratic function by no more than 0.3 percent.

In accordance with at least one embodiment, the port aperture 108 has a port aperture area substantially equal to the cross sectional area of the horn portion 107 proximate to the port aperture 108. The port aperture area of port aperture 108 can be described with respect to a port effective radius, which denotes a radius that a circle would have if it had the same area as the port aperture area of port 108, as port aperture 108 may, but need not be, circular in shape.

In accordance with at least one embodiment, the port aperture 108 has a port effective radius that is mathematically related to a driver radius of a driven portion (e.g., speaker cone) of driver 103. In accordance with at least one embodiment, the ratio of the port effective radius to the driver radius is approximately 1.1985. For example, for a driver 103 having a driver area of approximately 5.67266 square inches and a radius of approximately 1.34375 inches, the port aperture area is approximately 8.148 square inches, for a port effective radius of 1.61046 inches. In accordance with at least one embodiment, the ratio of the port effective radius to the driver radius is between 1.15 and 1.25. In accordance with at least one embodiment, the ratio of the port effective radius to the driver radius is between 1.1 and 1.3. In accordance with at least one embodiment, the ratio of the port effective radius to the driver radius is between 1.0 and 1.4.

In accordance with at least one embodiment, a driver aperture radius of driver aperture 104 approximates the driver radius of the driven portion (e.g., speaker cone) of driver 103. Therefore, the mathematical relationships of the port effective radius in relation to the driver radius can also be applied with respect to the port effective radius in relation to the driver aperture radius. Also, the mathematical relationships of the port aperture area of port aperture 108 in relation to the driver area of the driver portion of driver 103 can also be applied with respect to the port aperture area in relation to the driver aperture area.

Particular dimensions of horn portion 107, driver housing portion 106, and their relationships, such as the cross sectional area of the aperture defined between horn portion 107 and driver housing portion 106 to provide communication and propagation of acoustic waves between driver housing portion 106 and horn portion 107, are, in accordance with at least one embodiment, determined as a function of mechanical and/or electrical parameters of driver 103. For example, those dimensions and relationships can be determined as a function of a compliance of driver 103. The compliance of driver 103 can depend, for example, on stiffnesses and/or resiliencies of a surround and a spider used to mount a speaker cone in driver 103. As another example, those dimensions and relationships can be determined as a function of a Q factor (i.e., quality factor) of driver 103. In accordance with at least one embodiment, the dimensions and relationships of the horn portion 107 and the driver housing portion 106 are selected so as to substantially match a mechanical impedance of the driver 103 to a mechanical impedance of free air present at the port aperture 108.

The loudspeaker frame 102 also defines an electrical terminal housing 109. Electrical terminal housing 109 can be used as an enclosure for electrical terminals for the loudspeaker assembly. For example, electrical terminals for driver 103 can be mounted in electrical terminal housing 109. Other electrical components may also be mounted in electrical terminal housing 109. For example, an electrical transformer for providing compatibility with 25 volt, 70.7-volt, or 100 volt distributed loudspeaker systems can be mounted in electrical terminal housing 109. As another example, an amplifier can be mounted in electrical terminal housing 109 to make the loudspeaker assembly a self-amplified loudspeaker assembly. As yet another example, a volume control can be mounted in electrical terminal housing 109. An adjustment aperture may be defined in electrical terminal housing 109 to allow access to the volume control through the grille so that adjustments may be easily made after the loudspeaker assembly has been installed in a surface, such as a ceiling. In accordance with at least one embodiment, fastener 113 (e.g., a screw, rivet, snap, etc.) is installed through an aperture defined in electrical terminal housing 109 to attach an electrical terminal to electrical terminal housing 109.

The loudspeaker frame 102 further comprises a conformal portion comprising substantially planar perimeter portion 111 and elevated portion 110. The conformal portion is adapted to conform to a rear baffle. The rear baffle provides a driver cavity wall for a driver cavity defined by the driver housing portion and a horn cavity wall for a horn cavity defined by the horn portion. The rear baffle is preferably constructed of a mat of fire resistant material, such as fiberglass or mineral wool, and may be covered with a porous or non-porous skin, such as, for example, aluminum. In one or more embodiments, the driver cavity wall and the horn cavity wall may reduce the Q of the Helmholtz resonator formed by the driver housing portion and the horn portion, thereby reducing unwanted peaks and/or nulls in the frequency response of the loudspeaker assembly.

The shape, dimensions, and relationships of the driver cavity and the horn cavity can be designed to provide a desired frequency response of the loudspeaker assembly. Because of the freedom with which the loudspeaker frame 102 may be formed so as to define the desired driver cavity and horn cavity, acoustical performance is not constrained by a rear baffle and sound baffle configuration. Rather, excellent acoustical performance can be obtained from a given rear baffle, even a low profile rear baffle, by providing a driver housing portion and horn portion appropriate for a driver and by defining a port aperture appropriate for the driver. The relationships between the driver characteristics, the driver housing portion characteristics, the horn portion characteristics, and the size of the port aperture can be designed to optimize frequency response and efficiency of the loudspeaker assembly. The port aperture is preferably larger than the driver aperture, which, in accordance with the acoustic impedance transformation provided by the horn portion, increases loudspeaker efficiency and acoustic response.

Figure 2:
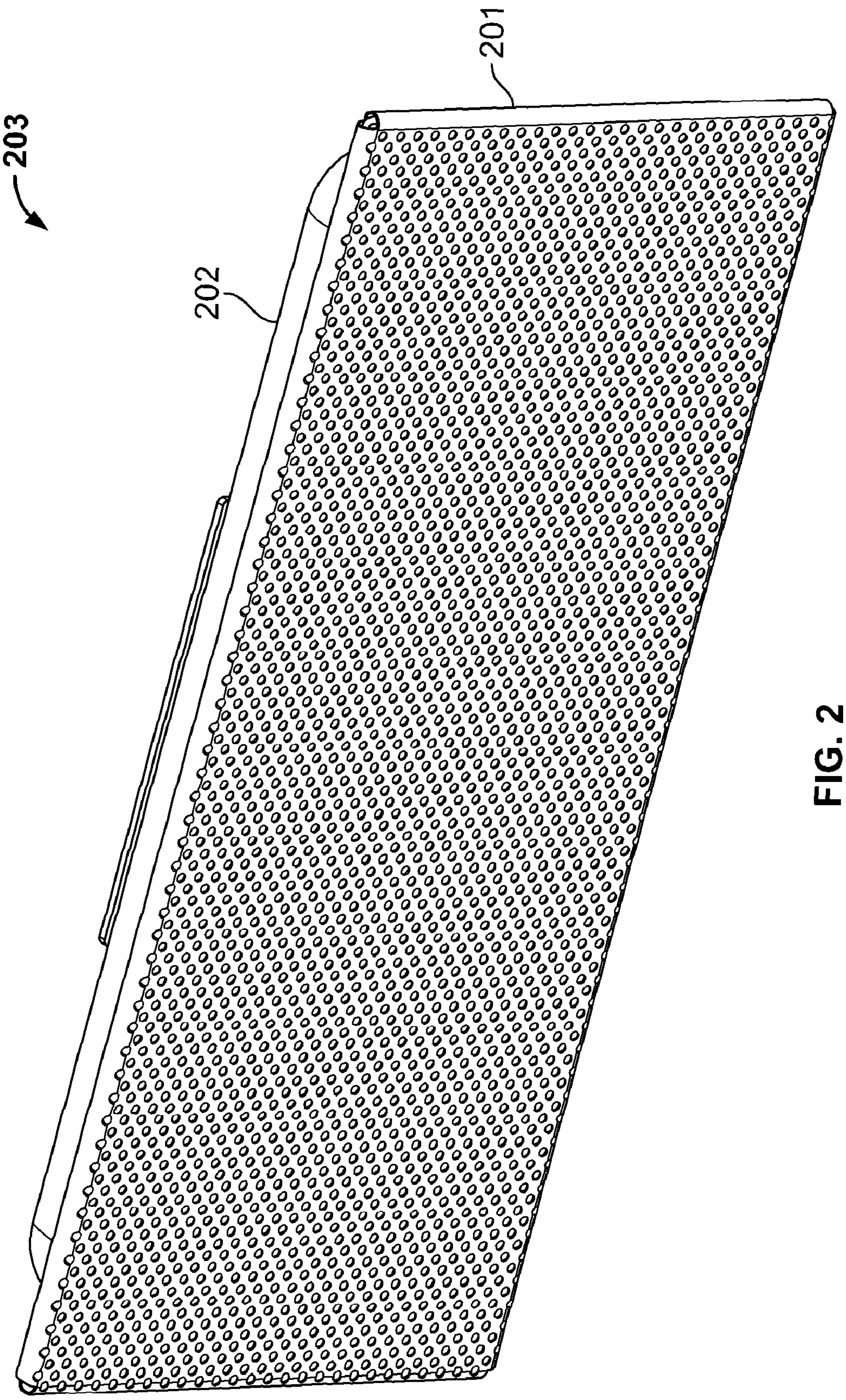
FIG. 2 is a perspective view of a loudspeaker assembly in accordance with at least one embodiment.

FIG. 2 is a perspective view of a loudspeaker assembly in accordance with at least one embodiment. The loudspeaker assembly 203 comprises a grille 201 and a rear baffle 202. The grille 201 and the rear baffle 202 enclose a loudspeaker frame and driver. The grille 201 is preferably substantially planar and preferably has a hole pattern and hole size selected for optimal acoustic transmission through grille 201 to eliminate reflections back in the loudspeaker. The grille 201 comprises an edge around its perimeter, and that edge is preferably substantially planar. The rear baffle 202 comprises an edge around its perimeter, and that edge is preferably substantially planar. The edge around the perimeter of grille 201 is preferably crimped to the edge around the perimeter of rear baffle 202, with the edge around the perimeter of a substantially planar perimeter portion of the loudspeaker frame disposed between the grille 201 and the edge around the perimeter of rear baffle 202, which maintains the loudspeaker frame in a fixed position relative to the grille 201 and the rear baffle 202. The crimp is also designed to provide a "crush" between the rear baffle 202 and the loudspeaker frame 102, which provides the critical seal for the horn and loudspeaker area. Any leakage out of the side of the loudspeaker would degrade acoustical performance Such leakage is prevented or minimized by the critical seal. In accordance with at least one embodiment, the grille 201 is rectangular. In accordance with at least one embodiment, the grille 201 is square.

Figure 3:
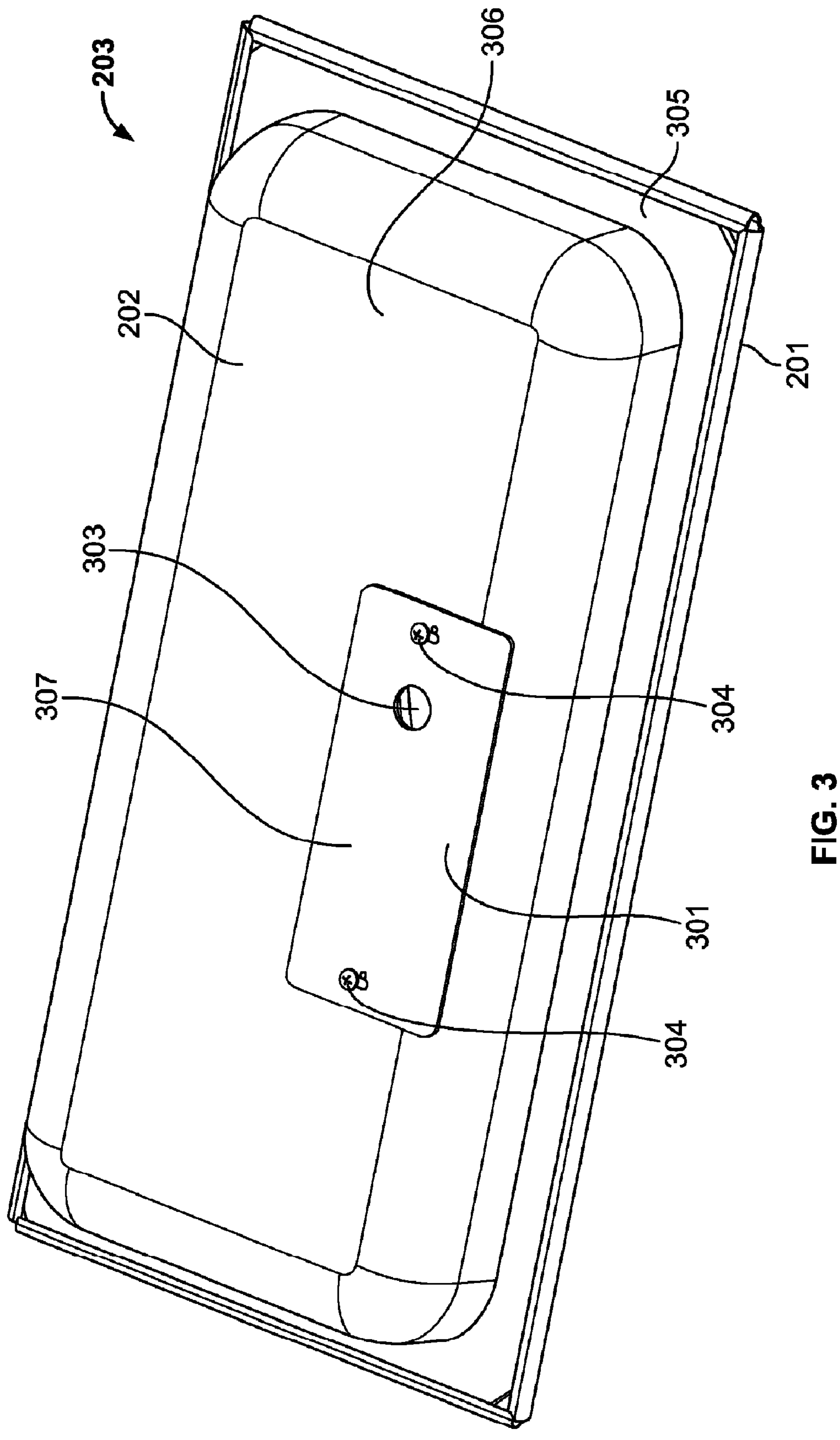
FIG. 3 is a perspective view of a loudspeaker assembly in accordance with at least one embodiment.

FIG. 3 is a perspective view of a loudspeaker assembly in accordance with at least one embodiment. The rear baffle 202 of the loudspeaker assembly 203 comprises a substantially planar perimeter portion 305 and an elevated portion 306. An electrical terminal cover plate 301 is mounted on the elevated portion 306 with fasteners 304. The electrical terminal cover plate 301 comprises a substantially planar portion 307. Fasteners 304 are preferably installed in the substantially planar portion 307. In accordance with at least one embodiment, a wiring aperture 303 through which wiring may pass is defined in a recessed portion underlying the substantially planar portion 307. The wiring may be connected to electrical terminals mounted in the recessed portion. The substantially planar perimeter portion 305 preferably lies substantially in a first plane, and the elevated portion 306 preferably lies substantially in a second plane, wherein the first plane is substantially parallel to the second plane.

Figure 4:
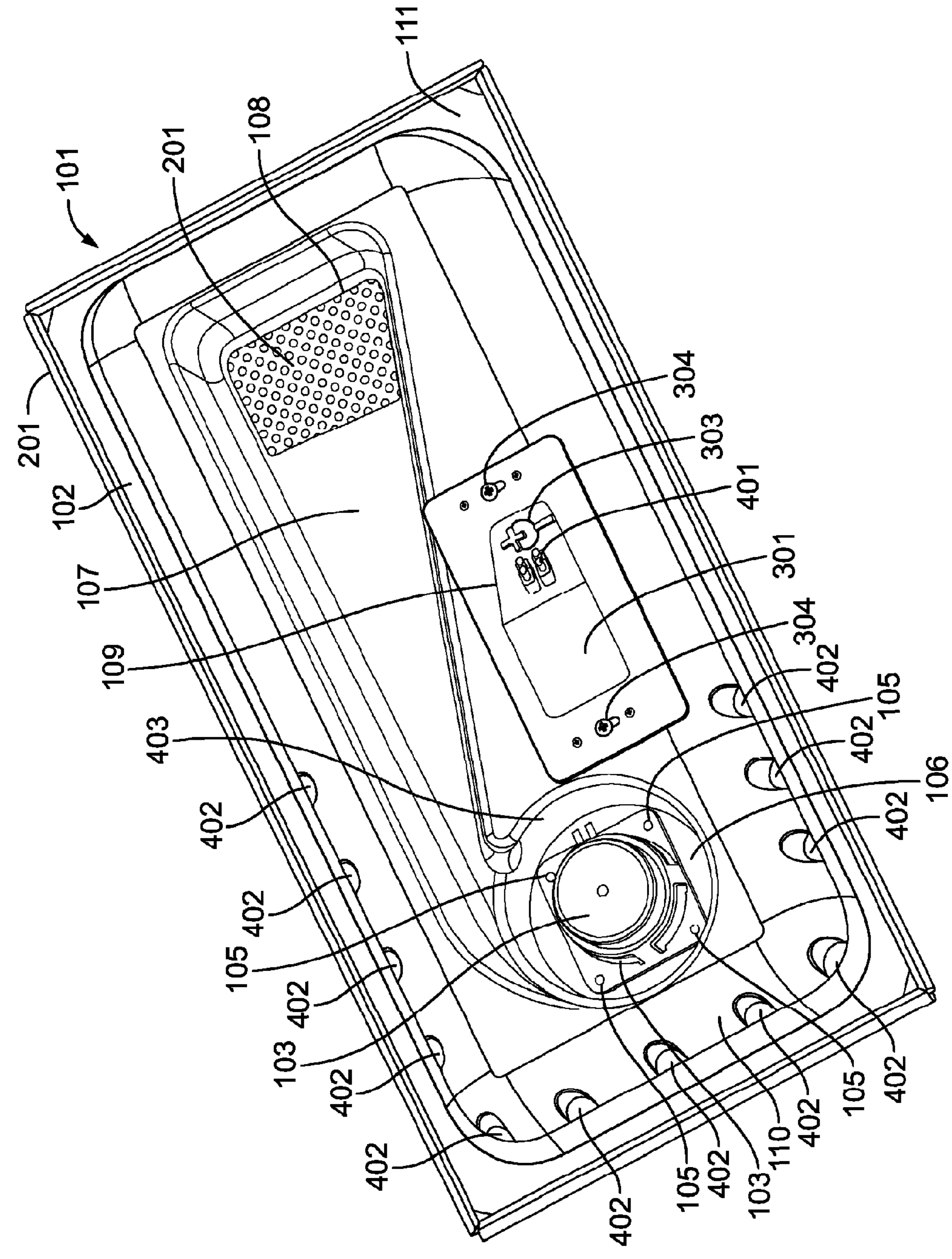
FIG. 4 is a perspective view of a loudspeaker frame subassembly in accordance with at least one embodiment.

FIG. 4 is a cutaway perspective view of a loudspeaker frame subassembly in accordance with at least one embodiment. FIG. 4 shows the loudspeaker frame subassembly in absence of rear baffle 202. The communication between loudspeaker driver housing portion 106 and horn portion 107 can be seen. The wide end of horn portion 107 is disposed such that port aperture 108 is proximate to a portion of grille 201. Since the port aperture 108 provides communication between the interior of rear baffle 202 and grille 201, the entirety of the rear baffle interior is not obstructed or masked from the grille 201. The internal edge of grille 201 that defines port aperture 108 lies adjacent to and almost coplanar with grille 201. Spacing between horn portion 107 and grille 201 can be provided to reduce the risk of unwanted vibrations. Electrical terminals 401 are disposed within recessed portion beneath electrical terminal cover plate 301 for connection of wiring routed through wiring aperture 303 to circuitry contained within electrical terminal housing 109 and/or to driver 103. By utilizing electrical terminals 401 in the form of a terminal block rather than wire nuts, the possibility of vibration of loosely contained wire nuts against the interior of the electrical terminal housing or the interior of a loudspeaker cabinet is avoided. Polarity of driver 103 is maintained from driver 103 to electrical terminals 401, which are marked as to their polarity, so that proper electrical phasing can be maintained during the manufacturing process. Polarity is defined by color coded wires and polarity markings vacuformed into the speaker frame.

Stiffeners 402 are defined in loudspeaker frame 102 around a portion of a periphery of elevated portion 110. In accordance with at least one embodiment, stiffeners 402 are of a substantially semicylindrical shape terminating in a substantially semicircular portion upon which ground plane 112 bears. By producing ground plane 112 from a material (e.g., metal) having a spring constant, a spring bias of ground plane 112 against stiffeners 402 maintains force between ground plane and loudspeaker frame 102 to suppress any resonant nodes that might otherwise cause vibrations or distortions that would adversely affect the frequency response of the loudspeaker assembly. In accordance with at least one embodiment, corrugations 403 are defined in an approximately cylindrical portion of driver housing portion 106 to help maintain the spring biased relationship between ground plane 112 and loudspeaker frame 102. In accordance with at least one embodiment, the ground plane 112 comprises a curved steel plate. In accordance with at least one embodiment, the ground plane 112 comprises a curved aluminum plate. In accordance with at least one embodiment, the ground plane 112 comprises a polymer plate. In accordance with at least one embodiment, the ground plane 112 comprises a composite plate.

Figure 5:
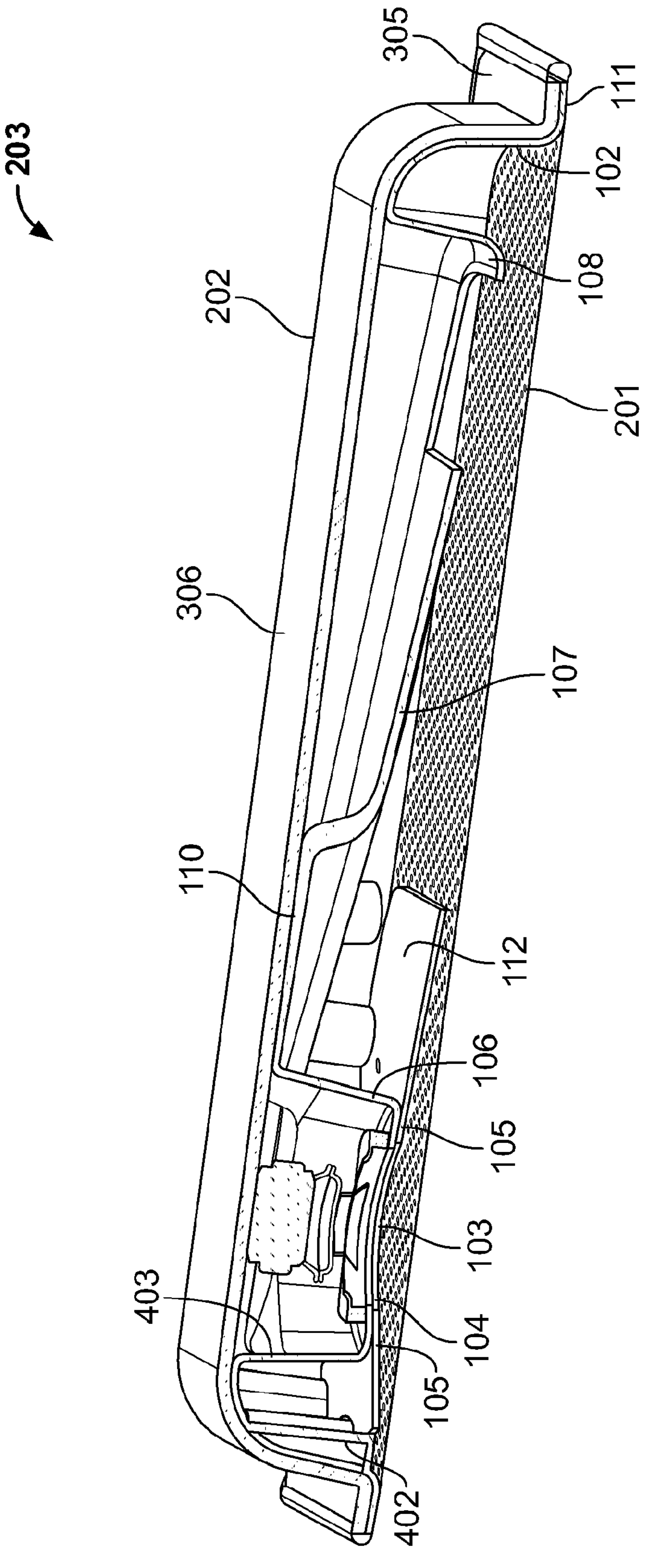
FIG. 5 is a sectional perspective view of a loudspeaker assembly in accordance with at least one embodiment.

FIG. 5 is a sectional perspective view of a loudspeaker assembly in accordance with at least one embodiment. As can be seen, a conformal portion of loudspeaker frame 102 comprising substantially planar perimeter portion 111 and elevated portion 110 substantially conforms to a shape of rear baffle 202 comprising substantially planar perimeter portion 305 and elevated portion 306. Substantially planar perimeter portion 111 lies adjacent to, parallel to, and nearly coplanar with substantially planar perimeter portion 305. Elevated portion 110 lies adjacent to, parallel to, and nearly coplanar with at least a portion of elevated portion 306. An edge around the perimeter of grille 201 is preferably crimped around substantially planar perimeter portion 111 and substantially planar perimeter portion 305 so as to combine grille 201, loudspeaker frame 102, and rear baffle 202 into a rigid, sealed assembly. The crimping of grille 201 preferably attaches grille 201 to rear baffle 202 in a non-releasable manner.

Since the conformal portion of loudspeaker frame 102 preferably substantially conforms to the shape of rear baffle 202, the shapes and dimensions of cavities defined in the loudspeaker frame 102 can be precisely controlled. For example, a driver cavity defined by the driver housing portion 106 and a portion of elevated portion 306 of rear baffle 202 provides a controlled volume around driver 103. As another example, a horn cavity defined by horn portion 107 and a portion of elevated portion 306 of rear baffle 202 provides a controlled volume between a communication port that joins driver housing portion 106 to horn portion 107 and port aperture 108. Not only can the volume of the horn cavity be controlled, but its shape can also be controlled so as to form a horn of increasing cross sectional area from the communication port to the port aperture.

While components such as grille 201 and rear baffle 202 may be custom designed for loudspeaker assembly 203, economies of scale can increase the economic efficiency of loudspeaker assembly 203 if standard parts are used for such components. For example, a grille 201 and rear baffle 202 designed for heating, ventilation, and cooling (HVAC) applications can be utilized to aesthetically match standard drop ceilings, as it appears to match standard HVAC ceiling diffusers, and to avoid the need for design and manufacturing of a grille 201 and rear baffle 202 specifically for use in a loudspeaker assembly. Also, testing and standards compliance can be simplified, as typical HVAC grilles and rear baffles are already rated with respect to standards, such as flame, smoke, and mechanical tests (e.g., erosion and impact, such as the UL181 standard). For example, an HVAC grille and rear baffle rated as complying with UL 1480, E84, and/or UL181 may be obtained. Compliance with such standards, for example, UL2043, allows for use of the loudspeaker in environmental air handling spaces. Furthermore, HVAC grilles may already incorporate features that provide standards compliance and enhance safety, such as seismic tie off tabs. Also, HVAC grilles may be made of materials with desirable properties that have been subjected to and passed rigorous performance testing. Such testing may include, for example, corrosion, humidity, and ultraviolet light exposure. By vacuum forming or injection molding loudspeaker frame 102 to facilitate construction of a unitized loudspeaker frame subassembly 101 that may be enclosed within grille 201 and rear baffle 202, loudspeaker frame subassembly 101 can easily be inserted between grille 201 and rear baffle 202 during assembly to yield a high performance loudspeaker assembly instead of merely a HVAC grille and rear baffle assembly. A hole can be cut in rear baffle 202 to accommodate electrical terminal cover plate 301, and electrical terminal cover plate 301 can be constructed of materials to maintain standards compliance.

A loudspeaker assembly adapted to be installed in a surface, such as a ceiling or wall, provides additional utility and convenience if it can be easily installed with minimal modification of the surface. By utilizing lightweight materials that comply with regulatory standards and that are formed into sizes and shapes that comply with industry standards, such as standard sizes of suspended ceiling tiles, a convenient lay-in loudspeaker assembly can be provided. An existing ceiling tile can be removed, wiring can be routed to the location where the ceiling tile was removed, the wiring can be connected to the electrical terminals 401 accessible from the exterior of the loudspeaker assembly, and the loudspeaker assembly can be inserted into the suspended ceiling to either fully or partially replace the removed ceiling tile. If appropriate, seismic tie-off tabs, and/or grid tie-offs may be secured. If necessary, a portion of the removed ceiling tile may be trimmed and replaced to complete the installation. By providing a volume control accessible through the grille 201, volume adjustment can be performed after the loudspeaker assembly has been installed in a surface without the need for removal from the surface. In accordance with at least one embodiment, the loudspeaker assembly can be mounted in a drywall surface.

By providing a loudspeaker frame 102 that has been formed, preferably vacuum formed, into a three dimensional shape that defines features such as a horn portion, the need for a two dimensional baffle sheet is avoided. Thus, disadvantages associated with two dimensional baffle sheets, such as vibration and sound distortion, can be avoided or minimized By forgoing a plate that mounts directly to a grille, and instead mounting a loudspeaker and associated components in the three dimensional loudspeaker frame, at least one embodiment allows the creation of a three-dimensional loaded horn design that greatly increases loudspeaker efficiency and provides performance from a much more efficient smaller driver (e.g., a three inch driver) that previously required a much larger driver (e.g., a six inch driver). Such a design can also keep the driver and any plates off of the grille, as contact between the driver or plates and the grille can produce vibration and distortion between the grille and the sound baffle sheet or plate as described above in other loudspeaker designs. Such a design can also allow the installation of an arched, hyperbolic ground plane (e.g., one having an approximately twenty foot radius of curvature at the center of the loudspeaker aperture) around the loudspeaker driver, that may be sized and shaped to adjust the sound field and the linearity of reproduction of audio content (e.g. pink noise). An arched ground plane can also help prevent unwanted rattling of loudspeaker assembly components by being spring biased against other loudspeaker assembly components. Such a design can also provide a more robust, sturdy design, which results in easier installation and less chance of shipping damage. The insulated rear baffle need not support the loudspeaker assembly structurally, as the loudspeaker frame provides sufficient rigidity to support the loudspeaker assembly structurally. Whereas the insulated rear baffle can act like a fire wrap, allowing adherence with life safety standards, the insulated rear baffle also provides additional stiffness in critical areas to prevent resonant nodes of the loudspeaker at certain frequencies. Accordingly, the insulated rear baffle helps assure a flat frequency response over a wide frequency range. The ground plane design can provide an approximately linear acoustical response for the loudspeaker. In addition, depending on its configuration, the ground plane can provide improved uniformity of dispersion of sound throughout the listening area, preventing "hot spots" or a spike in sound pressure level (SPL) which is perceived as volume, in certain locations under the loudspeaker.

Because weight is a consideration for a suspended lay-in loudspeaker assembly, it is ideal to make such a loudspeaker assembly as light as possible without sacrificing sound quality, regulatory compliance, mechanical stability, or aesthetics. The provision of a loudspeaker frame 102 formed into a three dimensional shape allows a more rigid loudspeaker assembly to be constructed from materials of a given type and thickness or a loudspeaker assembly to be constructed from thinner and/or lighter materials without sacrificing rigidity. Moreover, strong, lightweight materials that offer regulatory standards compliance are available as grilles and rear baffles for HVAC applications. HVAC rear baffles typically are formed from a fiberglass or mineral fiber mat, with their exterior surface (i.e., convex surface) covered with a foil material. To minimize weight, a lightweight foil material, such as an aluminum foil, may be used. While standard HVAC rear baffles and grilles may be used, particular materials may be specified to optimize performance of the loudspeaker assembly, if appropriate. In accordance with at least one embodiment, the grille has perforated metal sheet with perforations of a size designed to optimize acoustic response and eliminate reflections from the grill back into the interior of the loudspeaker.

By forming a loudspeaker frame 102 into a three dimensional form, the loudspeaker frame 102 provides sufficient rigidity to mount a driver 103 on it, thereby avoiding the need to mount a driver on a grille, which further improves aesthetic appearance by avoiding the need for mounting hardware, such as rivets, to be visible on the grille. By using the loudspeaker frame 102 to mount the driver 103, vibration of the grille and distortion arising from such vibration can also be avoided or minimized Furthermore, by not using the grille as a weight bearing element, the chance of the grille sagging under the weight of the driver is reduced. Since the horn portion redirects and transforms acoustic energy from the back of driver 103 in a direction generally parallel to the plane of the grille 201, the height of the loudspeaker assembly above the grille can be minimized Also, the formed loudspeaker frame 102 allows electrical terminal housing 109 to be recessed into and formed integral with the loudspeaker frame 102, which also helps lower the overall profile of the loudspeaker assembly. Thus, a loudspeaker of lower profile with a shallower rear baffle can be provided. Such lower profile loudspeaker assemblies can be installed in situations where installation might not be possible with higher profile loudspeaker assemblies. By using a specially formed loudspeaker frame 102 with a small, highly efficient driver 103, at least one embodiment provides a low profile loudspeaker assembly that can be installed in spaces that have limited vertical clearance.

The three dimensional form of the loudspeaker frame 102 and its ability to define a horn portion 107 allows a smaller and lighter driver 103 to be used to emulate the performance of a larger and heavier driver. Even with a smaller and lighter driver 103, the horn portion 107 provides the acoustic impedance transformation to allow the smaller surface area of the smaller and lighter driver 103 to move an equivalent amount of air as would the larger surface area of a larger and heavier driver. Thus, risks of sagging of the grille 201 and vibration and sound distortion are further reduced. Moreover, the ability to use a smaller and lighter driver 103 increases economic efficiency of the loudspeaker assembly.

Furthermore, the three dimensional form of the loudspeaker frame 102 and its ability to define a horn portion 107 allows a smaller and lighter driver 103 to be used to emulate the performance of multiple drivers. For example, some loudspeaker systems use multiple drivers to cover multiple frequency ranges. However, the acoustic impedance transformation provided by the horn portion 107 increases the acoustic impedance at the back of the driver 103, thereby assisting the front of the driver 103 to efficiently radiate higher frequency spectral content, yet it also decreases the acoustic impedance at the port aperture 108 to allow efficient coupling of lower frequency spectral content to the air in the room in front of port aperture 108. Thus, the horn portion 107 effectively performs a crossover function acoustically, rather than electrically, thereby avoiding the need for large and bulky inductive and capacitive elements to form an electrical crossover network. [Eliminating an electrical crossover also eliminates phase shifts that are inherent to typical crossover networks.] By implementing such crossover functionality acoustically using a lightweight loudspeaker frame 102 defining a horn portion 107, weight is reduced, the risk of sagging is reduced, acoustic efficiency is increased, and economic efficiency is increased.

At least one embodiment can be implemented to provide a loudspeaker assembly compatible with existing surfaces, such as existing ceiling tiles. For example, a 1×2 loudspeaker assembly can be implemented to replace half of a standard 2×2 ceiling tile or one quarter of a standard 2×4 ceiling tile. If more volume and/or power handling capability is desired, multiple loudspeaker assemblies, such as multiple 1×2 loudspeaker assemblies, can be ganged together and installed adjacent to one another within the space obtained by removing one or more ceiling tiles. Additional supports can be placed between the multiple loudspeaker assemblies, if desired.

Figure 6:
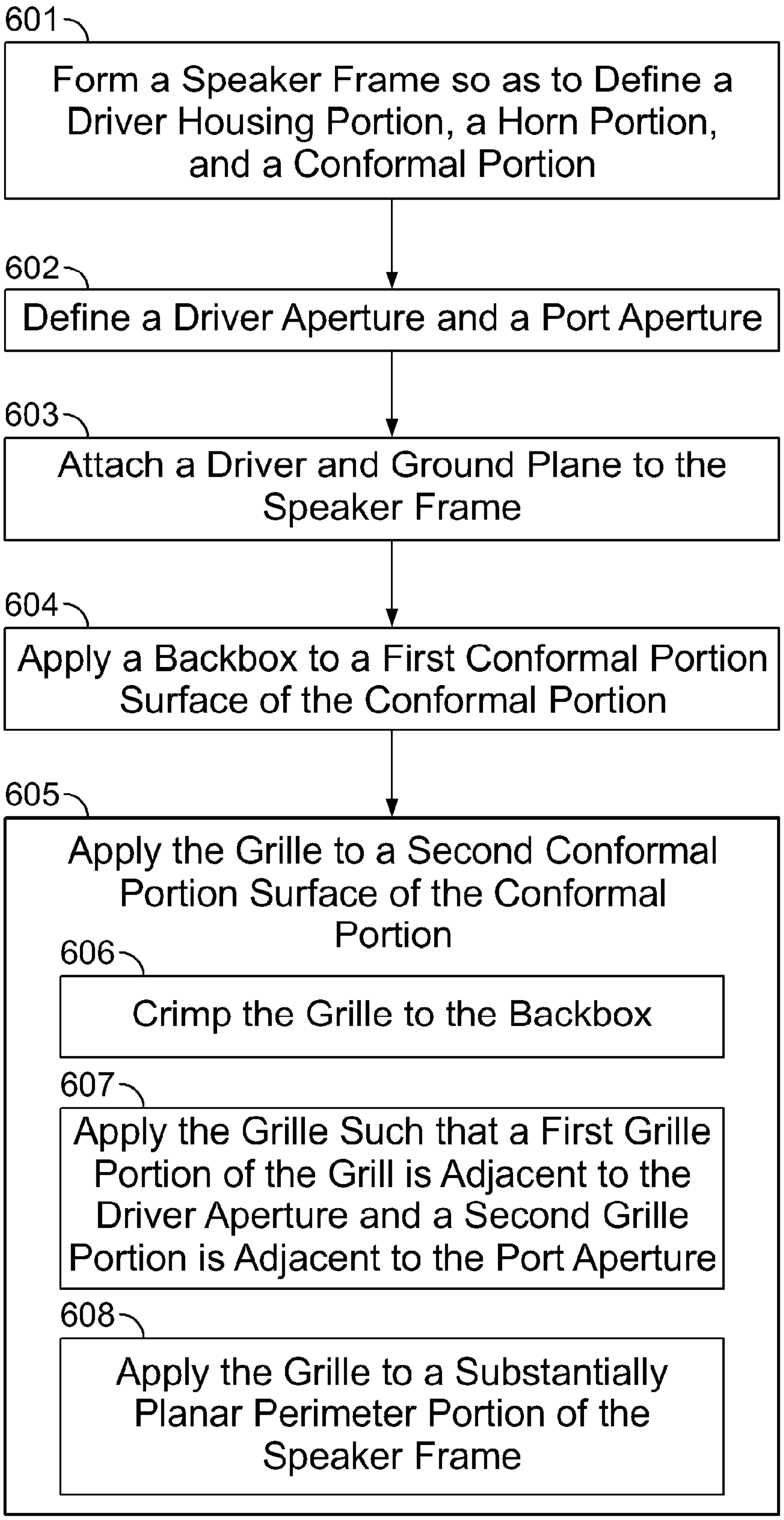
FIG. 6 is a flow chart of a method for a loudspeaker assembly in accordance with at least one embodiment.

FIG. 6 is a flow chart of a method for a loudspeaker assembly in accordance with at least one embodiment. The method begins in step 601, where a loudspeaker frame is formed so as to define a driver housing portion, a horn portion, and a conformal portion. The method continues to step 602, where a driver aperture is defined for the driver housing portion and a port aperture is defined for the horn portion. In step 603, a driver and ground plane are attached to the loudspeaker frame proximate to the driver aperture. In step 604, a rear baffle ("backbox") is applied to a first conformal portion surface of the conformal portion of the loudspeaker frame. The rear baffle defines a horn cavity wall of a horn cavity of the horn portion. The horn cavity has an increasing cross sectional area as the distance from the driver housing portion increases. In step 605, a grille is applied to a second conformal portion surface of the conformal portion of the loudspeaker frame. Applying the grille binds the loudspeaker frame to the rear baffle.

In accordance with at least one embodiment, the rear baffle further defines a driver cavity wall of a driver cavity of the driver housing portion. In accordance with at least one embodiment, the first conformal portion surface of the conformal portion substantially conforms to a first rear baffle surface of the rear baffle.

In accordance with at least one embodiment, step 605 further comprises step 606. In step 606, the grille is crimped to the rear baffle. In accordance with at least one embodiment, step 605 further comprises step 607. In step 607, the grille is applied such that a first grille portion of the grille is adjacent to the driver aperture and a second grille portion of the grille is adjacent to the port aperture. The first grille portion is substantially coplanar with the second grille portion. In accordance with at least one embodiment, the rear baffle is formed from a porous material such that the rear baffle defines the horn cavity wall to be a porous horn cavity wall, which is covered with a non-porous, aluminum skin.

In accordance with at least one embodiment, step 605 further comprises step 606. In step 606, the grille is applied to a substantially planar perimeter portion of the loudspeaker frame, wherein the substantially planar perimeter portion surrounds an elevated portion of the loudspeaker frame, the elevated portion of the loudspeaker frame surrounding the driver housing portion and the horn portion. In accordance with at least one embodiment, the substantially planar perimeter portion of the loudspeaker frame lies substantially in a first plane and the elevated portion of the loudspeaker frame lies substantially in a second plane, the first plane being substantially parallel to the second plane.

In accordance with at least one embodiment, the horn portion 107 is defined along a substantially linear axis approximately radial to driver housing portion 106. In accordance with at least one embodiment, the horn portion 107 is defined along a substantially linear axis approximately tangential to driver housing portion 106. In accordance with at least one embodiment, the horn portion 107 is defined along a substantially spiral line extending outward from driver housing portion 106. In accordance with at least one embodiment, the horn portion 107 is defined along a line that curves in alternating directions as it progresses away from driver housing portion 106.

In accordance with at least one embodiment, the loudspeaker frame 102 is vacuum formed from a polymer sheet into a three dimensional configuration. In accordance with at least one embodiment, the loudspeaker frame 102 is injection molded into a three dimensional configuration. In accordance with at least one embodiment, the loudspeaker frame 102 is cast into a three dimensional configuration. In accordance with at least one embodiment, the loudspeaker frame 102 is stamped into a three dimensional configuration.

When a loudspeaker system is to provide sound to a listener who might move in relation to the loudspeaker system or to multiple listeners at different locations with respect to the loudspeaker system, it is useful to provide a degree of control over the directivity of sound provided by the loudspeaker system. In accordance with at least one embodiment, the variation in sound pressure level provided to multiple listeners at different locations and for a listener who moves with respect to the location of the loudspeaker system may be reduced. In accordance with at least one embodiment, a ground plane defines a loudspeaker driver aperture, a loudspeaker driver is mounted in the loudspeaker driver aperture, and a perforated grille is installed such that a distance between the perforated grille and the ground plane is a desired function of the distance from the loudspeaker driver. In one or more embodiments, the function is such that the distance between the grille and the ground plane decreases with distance from the driver. Such a configuration can be used to reduce the variation in sound pressure level over a large area and over a wide angle of the position of a listener relative to the loudspeaker system. The angle with respect to the loudspeaker system may be measured relative to an axis of the loudspeaker driver, an axis of the ground plane, a line perpendicular to the ground plane that passes through the loudspeaker driver, an axis of the grille, and/or a line perpendicular to the grille that passes through the loudspeaker driver.

Figure 7:
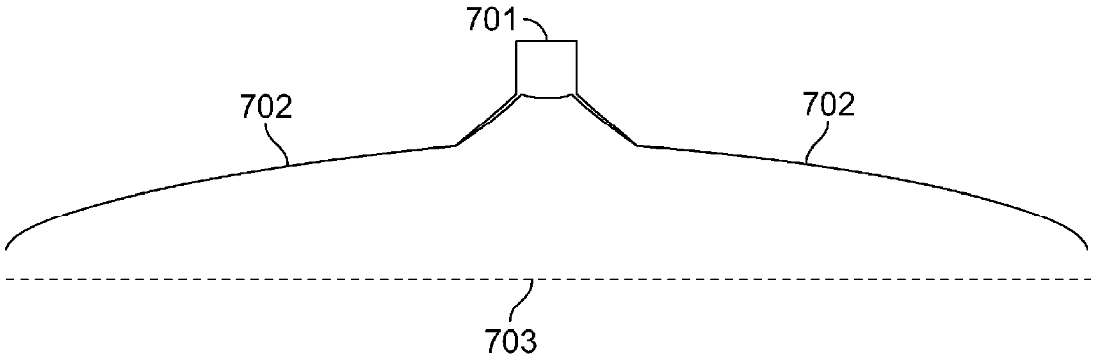
FIG. 7 is a cross sectional drawing of a grille and ground plane of a loudspeaker system in accordance with at least one embodiment.

FIG. 7 is a cross sectional drawing of a grille and ground plane of a loudspeaker system in accordance with at least one embodiment. The apparatus comprises a driver 701, a ground plane 702, and a grille 703. Driver 701 is installed in an aperture defined in ground plane 702. Ground plane 702 is concavely curved relative to grille 703, while grille 703 is substantially planar. Thus, the distance between ground plane 702 and grille 703 decreases with increasing distance from driver 701. Grille 703 is perforated. In accordance with at least one embodiment, the perforations of grille 703 are regular and circular.

In one or more embodiments, driver 701, ground plane 702, and grille 703, with its perforations, interact to reduce the variation in the sound field over a large area. For example, in one or more embodiments, if the apparatus is mounted in a ceiling, the apparatus can reduce the variation in sound pressure level (SPL) of sound to a listener within a range of up to approximately seven meters of the apparatus. If such a listener is walking within such range, not only may the distance of the listener's ears from the apparatus vary substantially, but also the angle between the axis of driver 701 and the listener's ears may vary substantially. For example, if a listener's ears are approximately two meters from the floor, and a ceiling speaker according to at least one embodiment of the apparatus is approximately 2.7 meters from the floor, the distance of the listener's ears from the speaker may vary from approximately 0.7 meters to approximately seven meters, or a ratio of 10:1, and the angle between the listener's ears and the axis of driver 701 may vary from zero degrees to approximately 85 degrees.

Figure 8:
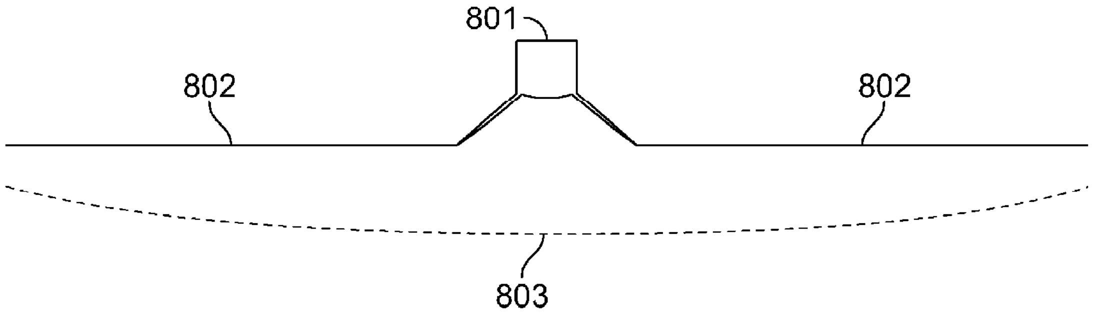
FIG. 8 is a cross sectional drawing of a grille and ground plane of a loudspeaker system in accordance with at least one embodiment.

FIG. 8 is a cross sectional drawing of a grille and ground plane of a loudspeaker system in accordance with at least one embodiment. The apparatus comprises a driver 801, a ground plane 802, and a grille 803. Driver 801 is installed in an aperture defined in ground plane 802. Ground plane 802 is approximately planar relative to grille 803, while grille 803 is concavely curved toward ground plane 802. Thus, the distance between ground plane 802 and grille 803 decreases with increasing distance from driver 801. Grille 803 is perforated. In accordance with at least one embodiment, the perforations of grille 803 are regular and circular.

Figure 9:
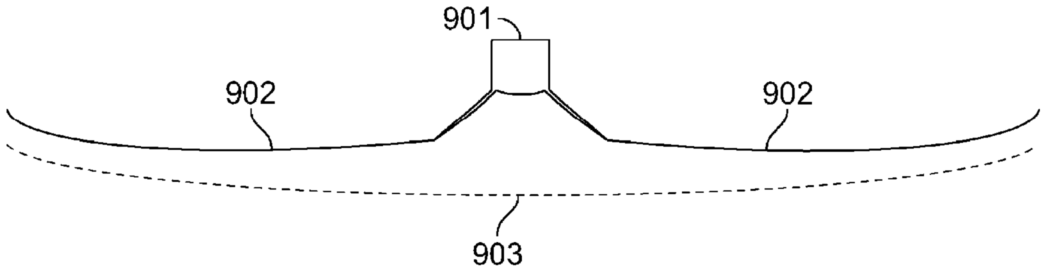
FIG. 9 is a cross sectional drawing of a grille and ground plane of a loudspeaker system in accordance with at least one embodiment.

FIG. 9 is a cross sectional drawing of a grille and ground plane of a loudspeaker system in accordance with at least one embodiment. The apparatus comprises a driver 901, a ground plane 902, and a grille 903. Driver 901 is installed in an aperture defined in ground plane 902. Ground plane 902 is convexly curved toward grille 903, while grille 903 is concavely curved toward ground plane 902 with a generally smaller radius of curvature than that of ground plane 902. Thus, the distance between ground plane 902 and grille 903 decreases with increasing distance from driver 901. Grille 903 is perforated. In accordance with at least one embodiment, the perforations of grille 903 are regular and circular.

Figure 10:
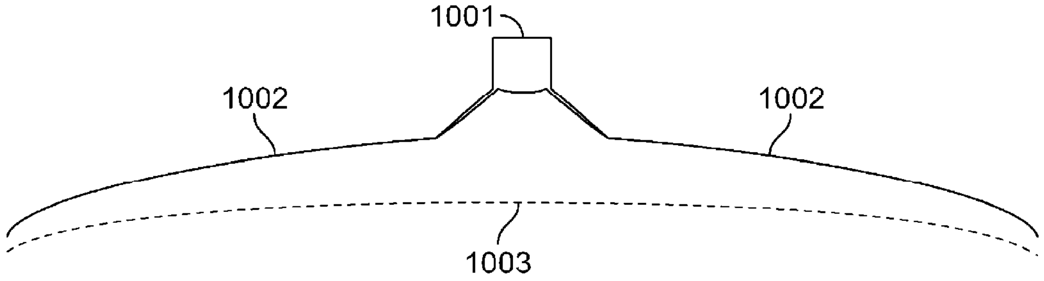
FIG. 10 is a cross sectional drawing of a grille and ground plane of a loudspeaker system in accordance with at least one embodiment.

FIG. 10 is a cross sectional drawing of a grille and ground plane of a loudspeaker system in accordance with at least one embodiment. The apparatus comprises a driver 1001, a ground plane 1002, and a grille 1003. Driver 1001 is installed in an aperture defined in ground plane 1002. Ground plane 1002 is concavely curved relative to grille 1003, while grille 1003 is convexly curved relative to ground plane 1002 with a generally larger radius of curvature than that of ground plane 1002. Thus, the distance between ground plane 1002 and grille 1003 decreases with increasing distance from driver 1001. Grille 1003 is perforated. In accordance with at least one embodiment, the perforations of grille 1003 are regular and circular.

Figure 11:
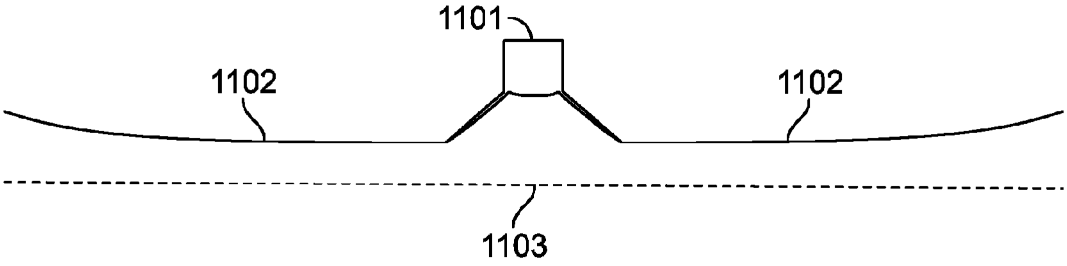
FIG. 11 is a cross sectional drawing of a grille and ground plane of a loudspeaker system in accordance with at least one embodiment.

FIG. 11 is a cross sectional drawing of a grille and ground plane of a loudspeaker system in accordance with at least one embodiment. The apparatus comprises a driver 1101, a ground plane 1102, and a grille 1103. Driver 1101 is installed in an aperture defined in ground plane 1102. Ground plane 1102 is convexly curved relative to grille 1103, while grille 1103 is generally planar. Thus, the distance between ground plane 1102 and grille 1103 increases with increasing distance from driver 901. Grille 1103 is perforated. In accordance with at least one embodiment, the perforations of grille 1103 are regular and circular.

Figure 12:
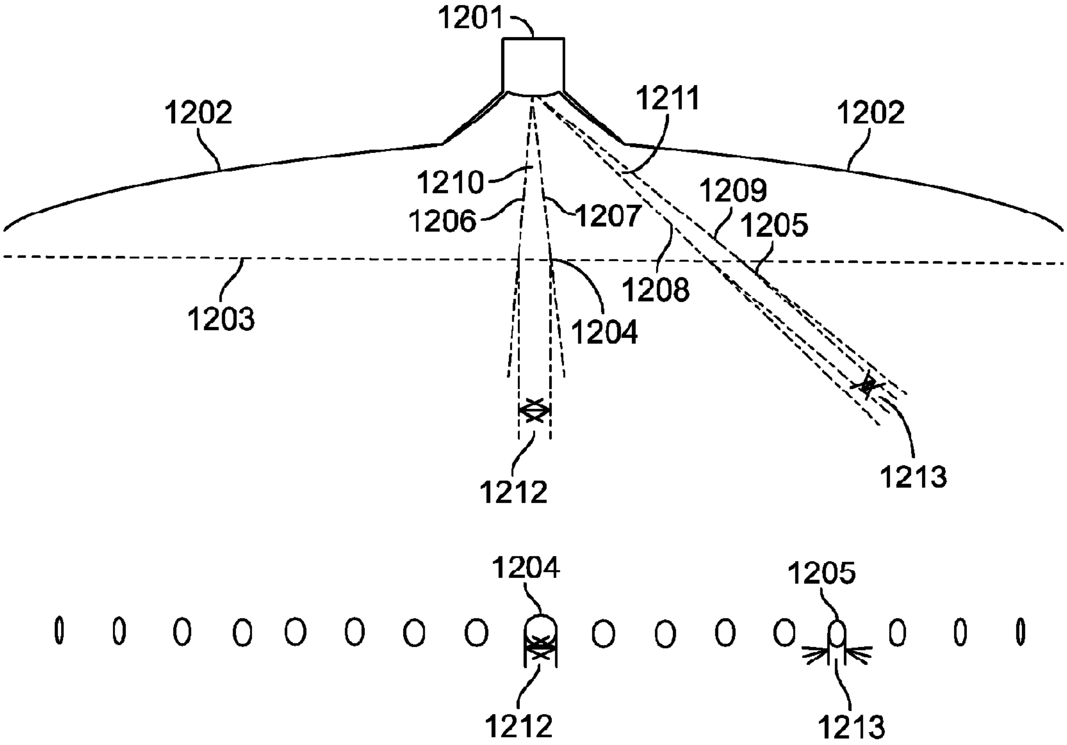
FIG. 12 is a cross sectional drawing of a grille and ground plane of a loudspeaker system in accordance with at least one embodiment.

FIG. 12 is a cross sectional drawing of a grille and ground plane of a loudspeaker system in accordance with at least one embodiment. The apparatus comprises a driver 1201, a ground plane 1202, and a grille 1203. Driver 1201 is installed in an aperture defined in ground plane 1202. The distance between ground plane 1202 and grille 1203 decreases with increasing distance from driver 1201. Grille 1203 is perforated. In accordance with at least one embodiment, the perforations of grille 1203 are regular and circular. However, as viewed from the perspective of driver 1201, although a perforation 1204 of grille 1203 axial to driver 1201 appears round, perforations of grille 1203 appear elliptical as the angle relative to the axis of driver 1201 increases. As the angle increases, the ratio of the major axis of each apparent ellipse to the minor axis of the same apparent ellipse also increases. Thus, far from the axis of driver 1201, the apparent ellipses formed by the circular holes defined in grille 1203 appear more like slits than circles. Therefore, a perforation 1205 far from the axis of driver 1201 appears elliptical as viewed from the perspective of driver 1201. The phenomenon that gives rise to the apparent ellipses can be seen by comparing the larger angle 1210 formed between lines of sight 1206 and 1207 aligned with the edges of perforation 1204 with the smaller angle 1211 formed between the lines of sight 1208 and 1209 aligned with the edges of perforation 1205. Those angles and the distances between the point of view at driver 1201 and the respective perforations 1204 and 1205 yield an apparent diameter 1212 of apparently circular perforation 1204 and an apparent minor diameter 1213 of apparently elliptical perforation 1205. As can be seen, apparent minor diameter 1213 is smaller than apparent diameter 1204, which gives the appearance that perforation 1205 is elliptical. As slit apertures are understood to affect sound pressure wave transmission, reflection, and diffraction differently than circular apertures, apparently elliptical perforations that approximate slit apertures can be utilized to favorably affect sound pressure waves, such as those generated by driver 1201.

Figure 13:
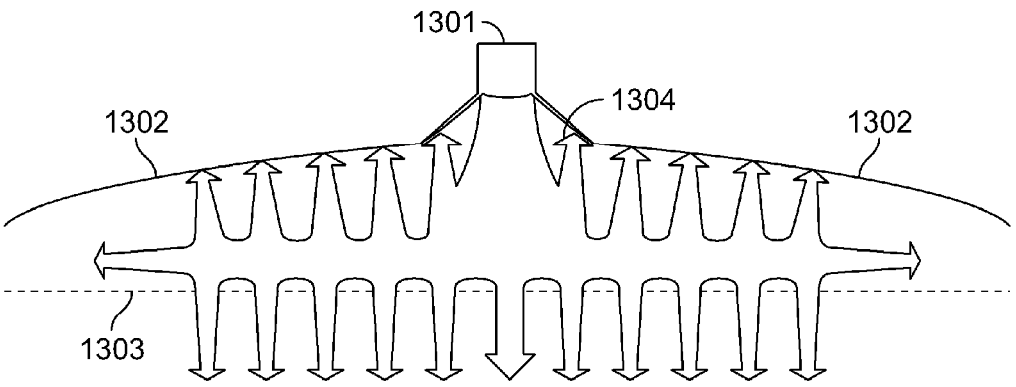
FIG. 13 is a cross sectional drawing of a grille and ground plane of a loudspeaker system in accordance with at least one embodiment.

FIG. 13 is a cross sectional drawing of a grille and ground plane of a loudspeaker system in accordance with at least one embodiment. The apparatus comprises a driver 1301, a ground plane 1302, and a grille 1303. Driver 1301 is installed in an aperture defined in ground plane 1302. The distance between ground plane 1302 and grille 1303 decreases with increasing distance from driver 1301. Grille 1303 is perforated. The sound pressure wave 1304 created by driver 1301 interacts with grille 1303 and its perforations. In accordance with at least one embodiment, the relationship of the perforations of grille 1303 to ground plane 1302 creates a variation in the velocity of air movement as the distance from the driver changes. It is understood that interaction of the plurality of sound pressure wave fronts emanating from what may practically be considered to be a plurality of point sources formed by the plurality of perforations in grille 1303 can affect the directivity of the loudspeaker system.

The rate and manner in which the distance between the ground plane 1302 and the grille 1303 changes with distance from the driver 1301 can affect the directivity of the loudspeaker system. The rate and manner of change is depends of the relative shapes of ground plane 1302 and grille 1303 and may, for example, be a function of distance from driver 1301. Grille 1303 and ground plance 1302 may each have a variety of shapes, including planar, conical, parabolic, spherical, hyperbolic, or ellipsoidal. For example, in accordance with at least one embodiment, ground plane 1302 can be of curved, hyperbolic shape with a radius of curvature of proximate to driver 1301 of approximately 20 feet and grille 1303 may be of planar shape.

The size, shape, and spacing of the perforations in grille 1303 can be varied to affect the directivity of the loudspeaker system. For example, the ratio of the surface area of the solid portion of grille 1303 surrounding the perforations to the surface area defined by the perforations will affect the portion of the sound wave energy from driver 1301 that is reflected back toward ground plane 1302 by the solid portion of grille 1303 relative to the transmitted portion of the sound wave energy from driver 1301 that is transmitted through the perforations of grille 1303. In addition to, or as an alternative to, varying the characteristics of grille 1303, characteristics of driver 1301 and ground plane 1302, as well as other characteristics of the loudspeaker system, such as the size and shape of the loudspeaker system's enclosure and porting, if any, can also be varied to modify the sound pattern from the loudspeaker system. For example, in accordance with at least one embodiment, grille 1303 can be constructed from perforated sheet metal of a type typically used in HVAC vent grilles. In accordance with at least one embodiment, grille 1303 can have circular holes with a ratio of the surface area of the solid portion of the grille 1303 surrounding the perforations to the surface area defined by the perforations between 0.5 and 3. In accordance with at least one embodiment, such ratio can be between 1 and 2.5. In accordance with at least one embodiment, the size of grille 1303 can be approximately two feet by 1 foot, and driver 1301 can be coupled to a port having increasing cross sectional area with increased distance from driver 1301.

Figure 14:
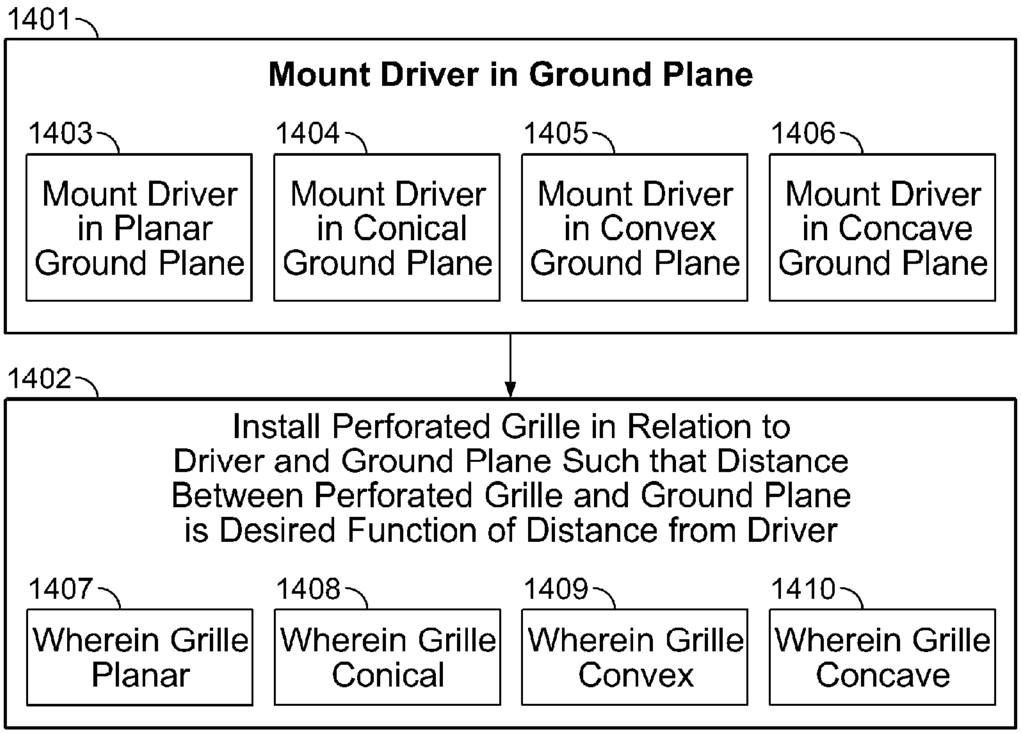
FIG. 14 is a flow diagram illustrating a method for installing a grille and ground plane of a loudspeaker system in accordance with at least one embodiment.

FIG. 14 is a flow diagram illustrating a method for varying the sound pattern of a loudspeaker system in accordance with at least one embodiment. The method begins in step 1401, where a driver is mounted in a ground plane. In accordance with at least one embodiment, step 1401 may include any of steps 1403, 1404, 1405, or 1406. In step 1403, the driver is mounted in a planar ground plane. In step 1404, the driver is mounted in a conical ground plane. In step 1405, the driver is mounted in a convex ground plane. In step 1406, the driver is mounted in a concave ground plane. A convex ground plane or concave ground plane may have a simple curved surface, for example, a parabolic, spherical, hyperbolic, or ellipsoidal curved surface, or it may have a a more complex surface having at least one curved surface or at least one non-curved surface, for example, a combination of curves of different shapes, directions and/or orientations.

From step 1401, the method continues to step 1402, where a perforated grille in installed in relation to the driver and ground plane such that the distance between the perforated grille and ground plane conforms to the desired function of distance from the driver. For example, in one or more embodiments, the desired function may be that the distance between the grille and ground plane increases with distance from the driver, decreases with distance from the driver, stays the same, or varies in a more complex manner. In accordance with at least one embodiment, step 1402 may include any of steps 1407, 1408, 1409, or 1410. In step 1407, the perforated grille being installed is a planar perforated grille. In step 1408, the perforated grille being installed is a conical perforated grille. In step 1409, the perforated grille being installed is a convex perforated grille. In step 1410, the perforated grille being installed is a concave perforated grille. A convex perforated grille or concave perforated grille may have a simple curved surface, for example, a parabolic, spherical, hyperbolic, or ellipsoidal curved surface, or it may have a a more complex surface having at least one curved surface or at least one non-curved surface, for example, a combination of curves of different shapes, directions and/or orientations.

Thus, a method and apparatus for a loudspeaker assembly is described. Although the present invention has been described with respect to certain specific embodiments, it will be clear to those skilled in the art that the inventive features of the present invention are applicable to other embodiments as well, all of which are intended to fall within the scope of the present invention.

What is claimed is:

1. A lay-in ceiling speaker assembly comprising:

a perforated grille comprising a first edge around a perimeter of said grille; a three-dimensional speaker frame comprising a second edge around a perimeter of said speaker frame, said second edge of said speaker frame situated adjacent said first edge of said grille;

a speaker driver mounted to and supported by said speaker frame, said speaker frame maintaining said speaker driver spaced apart from said grille;

a resilient ground plane mounted to and supported by said speaker frame such that said ground plane exerts a spring biasing force between said ground plane and said speaker frame;

a three-dimensional rear baffle comprising an interior and a third edge around a perimeter of said rear baffle, said third edge of said rear baffle situated adjacent said second edge of said speaker frame;

wherein said first edge of said grille is crimped around said third edge of said rear baffle so as to maintain said speaker frame in a fixed position relative to said grille and said rear baffle.

2. The speaker assembly of claim 1 wherein said speaker frame is formed so as define a controlled volume around said speaker driver.

3. The speaker assembly of claim 2 wherein said controlled volume is defined by said speaker frame and said rear baffle.

4. The speaker assembly of claim 2 wherein said controlled volume comprises a driver cavity.

5. The speaker assembly of claim 4 wherein said controller volume further comprises a horn cavity.

6. The speaker assembly of claim 5 wherein said horn cavity is defined by said speaker frame and said rear baffle.

7. The speaker assembly of claim 2 wherein said speaker frame comprises a driver aperture in which said speaker driver is mounted.

8. The speaker assembly of claim 2 wherein said speaker frame comprises a port aperture in communication with said controlled volume.

9. The speaker assembly of claim 5 wherein said speaker frame comprises a port aperture in communication with said controlled volume.

10. The speaker assembly of claim 9 wherein a first end of said horn cavity is in communication with said driver cavity and a second end of said horn cavity is in communication with said port aperture.

11. The speaker assembly of claim 10 wherein said speaker frame comprises a driver aperture in which said speaker driver is mounted.

12. The speaker assembly of claim 11 wherein said port aperture has a port aperture area and said driver aperture has a driver aperture area, said port aperture area being greater than said drive aperture area.

13. The speaker assembly of claim 1 wherein said speaker frame is vacuum-formed.

14. The speaker assembly of claim 13 wherein said rear baffle comprises a foil-covered exterior.

15. The speaker assembly of claim 1 wherein said speaker frame defines an electrical terminal housing.

16. The speaker assembly of claim 1 wherein said speaker frame comprises integrally formed stiffeners.

17. The speaker assembly of claim 1 wherein said ground plane is attached to said speaker frame adjacent to said speaker driver.

18. A lay-in ceiling speaker assembly comprising:

a perforated grille comprising a first edge around a perimeter of said grille; a three-dimensional speaker frame comprising a second edge around a perimeter of said speaker frame, said second edge of said speaker frame situated adjacent said first edge of said grille;

a speaker driver mounted to and supported by said speaker frame, said speaker frame maintaining said speaker driver spaced apart from said grille;

a resilient ground plane mounted to and supported by said speaker frame such that said ground plane exerts a spring biasing force between said ground plane and said speaker frame;

a three-dimensional rear baffle comprising an interior and a third edge around a perimeter of said rear baffle, said third edge of said rear baffle situated adjacent said second edge of said speaker frame;

wherein said first edge of said grille is crimped around said third edge of said rear baffle so as to maintain said speaker frame in a fixed position relative to said grille and said rear baffle;

wherein said speaker frame and said rear baffle define a controlled volume around said speaker driver, said controlled volume comprising a driver cavity and a horn cavity, said horn cavity having a first end in communication with said driver cavity and a second end in communication with a port aperture of said speaker frame.

19. The speaker assembly of claim 18 wherein said speaker frame comprises a driver aperture in which said speaker driver is mounted and wherein said port aperture has a port aperture area and said driver aperture has a driver aperture area, said port aperture area being greater than said drive aperture area.

20. The speaker assembly of claim 18 wherein said rear baffle comprises a foil-covered exterior.

* * * * *